(12) United States Patent
Pai et al.

(10) Patent No.: US 9,489,878 B2
(45) Date of Patent: Nov. 8, 2016

(54) SHIFT REGISTER

(71) Applicant: AU Optronics Corp., Hsin-Chu (TW)

(72) Inventors: Cheng-Chiu Pai, Hsin-Chu (TW);
Ming-Hung Chuang, Hsin-Chu (TW);
Shu-Wen Tzeng, Hsin-Chu (TW);
Wei-Chien Liao, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 114 days.

(21) Appl. No.: 14/564,104

(22) Filed: Dec. 9, 2014

(65) Prior Publication Data

US 2015/0179277 A1 Jun. 25, 2015

(30) Foreign Application Priority Data

Dec. 20, 2013 (TW) .............................. 102147563 A (51) Int. Cl.
*G11C 19/00* (2006.01)
*G09G 3/20* (2006.01)
*G11C 19/28* (2006.01)
*G09G 3/36* (2006.01)

(52) U.S. Cl.
CPC ................ *G09G 3/20* (2013.01); *G11C 19/28* (2013.01); *G09G 3/3674* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 6,556,646 B1* | 4/2003 | Yeo | ...................... | G09G 3/3677 377/54 |
| 6,970,530 B1* | 11/2005 | Wang | ................... | G11C 19/282 345/100 |
| 7,567,230 B2 | 7/2009 | Iida | | |
| 7,612,754 B2* | 11/2009 | Kuo | ..................... | G09G 3/3677 345/100 |
| 7,907,113 B2* | 3/2011 | Jang | ..................... | G09G 3/3607 345/100 |
| 7,995,049 B2* | 8/2011 | Yu | ........................ | G09G 3/3685 327/241 |
| 8,232,955 B2 | 7/2012 | Kwon | | |
| 8,320,516 B2* | 11/2012 | Toyotaka | ............. | G11C 19/184 377/64 |
| 9,001,959 B2* | 4/2015 | Koyama | ............. | H01L 27/1225 377/64 |
| 2004/0140839 A1* | 7/2004 | Nagao | .................... | G11C 19/28 327/291 |
| 2005/0220263 A1* | 10/2005 | Moon | .................... | G11C 19/00 377/68 |
| 2008/0219401 A1* | 9/2008 | Tobita | .................. | G09G 3/3677 377/79 |
| 2010/0086097 A1* | 4/2010 | Tseng | ..................... | G11C 19/28 377/79 |
| 2011/0216877 A1* | 9/2011 | Hsu | ........................ | G11C 19/00 377/79 |
| 2011/0274234 A1* | 11/2011 | Sakamoto | ............ | G11C 19/184 377/64 |
| 2012/0262438 A1* | 10/2012 | Shang | .................... | G11C 19/28 345/211 |
| 2013/0077736 A1* | 3/2013 | Son | .......................... | G09G 3/20 377/69 |
| 2014/0159999 A1* | 6/2014 | Gu | ....................... | G09G 3/3677 345/100 |
| 2015/0302936 A1* | 10/2015 | Ma | .......................... | G11C 19/28 377/64 |
| 2016/0019976 A1* | 1/2016 | Pai | ........................ | G11C 19/28 345/204 |

\* cited by examiner

*Primary Examiner* — Tuan T Lam
(74) *Attorney, Agent, or Firm* — McClure, Qualey & Rodack, LLP (57) ABSTRACT

A shift register has an input stage circuit, a first switch, a control circuit and a pull down circuit. A first end of the first switch receives a first clock signal. A second end and a control end of the first switch are respectively coupled to an output end of the shift register and a first output end of the input stage circuit. The control circuit controls electrical connection between a first power terminal and a node according to a second clock signal and controls electrical connection between the node and a second power terminal according to a voltage level of a second output end of the input stage circuit. The pull down circuit controls electrical connection between the second output end and the second power terminal and electrical connection between the output end and the second power terminal according to a voltage level of the node.

15 Claims, 9 Drawing Sheets

SHIFT REGISTER

BACKGROUND OF THE INVENTION

1. Field of the Invention

The present disclosure is related to a shift register, and more particularly to a shift register capable of suppressing a leakage current thereof.

2. Description of the Prior Art

In general, a display panel has a plurality of pixels, a gate driver and a source driver. The source driver is configured to write data signals into turned-on pixels. The gate driver has a plurality of shift register stages which are employed to generate plural gate signals for controlling operations of turning on/off the pixels. However, the number of transistors of the shift register according to the prior art is excessive, such that it is difficult to achieve a narrow peripheral region design of the display panel, where the peripheral region is located around a matrix of the pixels of the display panel.

SUMMARY OF THE INVENTION

An embodiment of the present disclosure provides a shift register. The shift register comprises an input stage circuit, a first switch, a first control circuit and a pull down circuit. The input stage circuit is configured to receive at least an input signal. A first end of the first switch is configured to receive a first clock signal, a second end of the first switch is coupled to an output end of the shift register, and a control end of the first switch is coupled to a first output end of the input stage circuit. The first control circuit comprises a second switch and a third switch. A first end of the second switch is coupled to a first system power terminal, a second end of the second switch is coupled to a node, and a control end of the second switch is configured to receive a second clock signal. A first end of the third switch is coupled to the node, a second end of the third switch is coupled to a second system power terminal, and a control end of the third switch is coupled to a second output end of the input stage circuit. The pull down circuit comprises a fourth switch and a fifth switch. A first end of the fourth switch is coupled to the second output end of the input stage circuit, a second end of the fourth switch is coupled to the second system power terminal, and a control end of the fourth switch is coupled to the node. A first end of the fifth switch is coupled to the output end of the shift register, a second end of the fifth switch is coupled to the second system power terminal, and a control end of the fifth switch is coupled to the node.

According to the embodiments of the present disclosure, a leakage current of the shift register is suppressed, such that energy consumption is reduced. Moreover, the shift register has fewer transistors due to a compact design, such that the cost thereof could be increased and that it is suitable to achieve the narrow peripheral region design of the display panel, where the peripheral region is located around a matrix of the pixels of the display panel.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
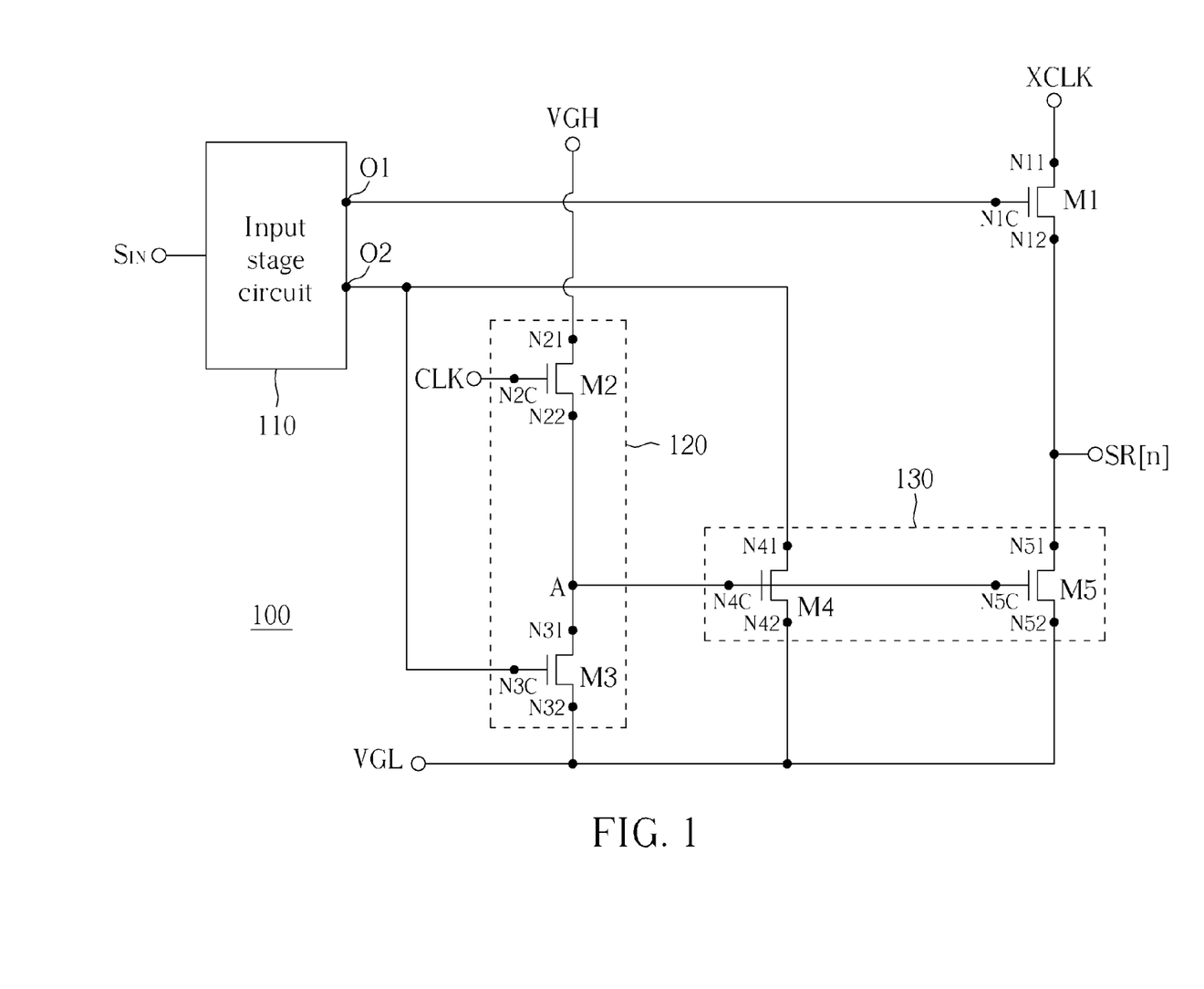
FIG. 1 is a schematic diagram of a shift register according to an embodiment of the present disclosure.

Please refer to FIG. 1. FIG. 1 is a schematic diagram of a shift register 100 according to an embodiment of the present disclosure. The shift register 100 may be utilized in a gate driver of a display panel, and the gate driver may comprise a plurality of stages of the shift register 100 to provide a plurality of gate signals to controls the operations of turning on/off the pixels of the display panel. The shift register 100 has an input stage circuit 110, a first switch M1, a first control circuit 120 and a pull down circuit 130. The input stage circuit 110 is configured to receive an input signal $S_{IN}$. A first end N11 of the first switch M1 is configured to receive a first clock signal XCLK, a second end N12 of the first switch M1 is coupled to an output end SR[n] of the shift register 100, and a control end N1C of the first switch M1 is coupled to a first output end O1 of the input stage circuit 110. The first control circuit 120 comprises a second switch M2 and a third switch M3. A first end N21 of the second switch M2 is coupled to a first system power terminal VGH, a second end N22 of the second switch M2 is coupled to a node A, and a control end N2C of the second switch M2 is configured to receive a second clock signal CLK. A first end N31 of the third switch M3 is coupled to the node A, a second end N32 of the third switch M3 is coupled to a second system power terminal VGL, and a control end N3C of the third switch M3 is coupled to a second output end O2 of the input stage circuit 110. The pull down circuit 130 comprises a fourth switch M4 and a fifth switch M5. A first end N41 of the fourth switch M4 is coupled to the second output end O2 of the input stage circuit 110, a second end N42 of the fourth switch M4 is coupled to the second system power terminal VGL, and a control end N4C of the fourth switch M4 is coupled to the node A. A first end N51 of the fifth switch M5 is coupled to the output end SR[n] of the shift register 100, a second end N52 of the fifth switch M5 is coupled to the second system power terminal VGL, and a control end N5C of the fifth switch M5 is coupled to the node A.

Figure 2:
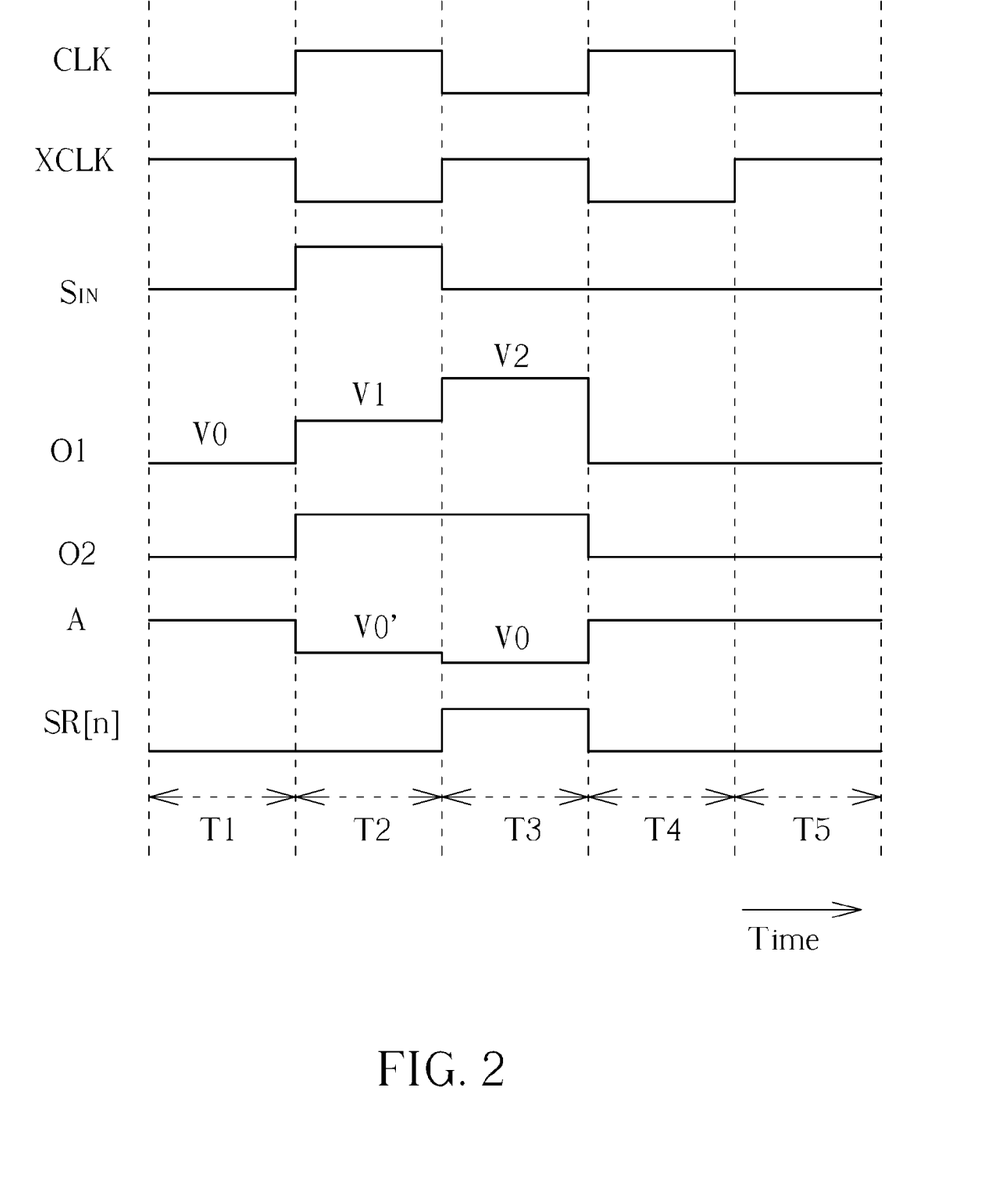
FIG. 2 is a timing diagram of the shift register in FIG. 1.
Figure 5:
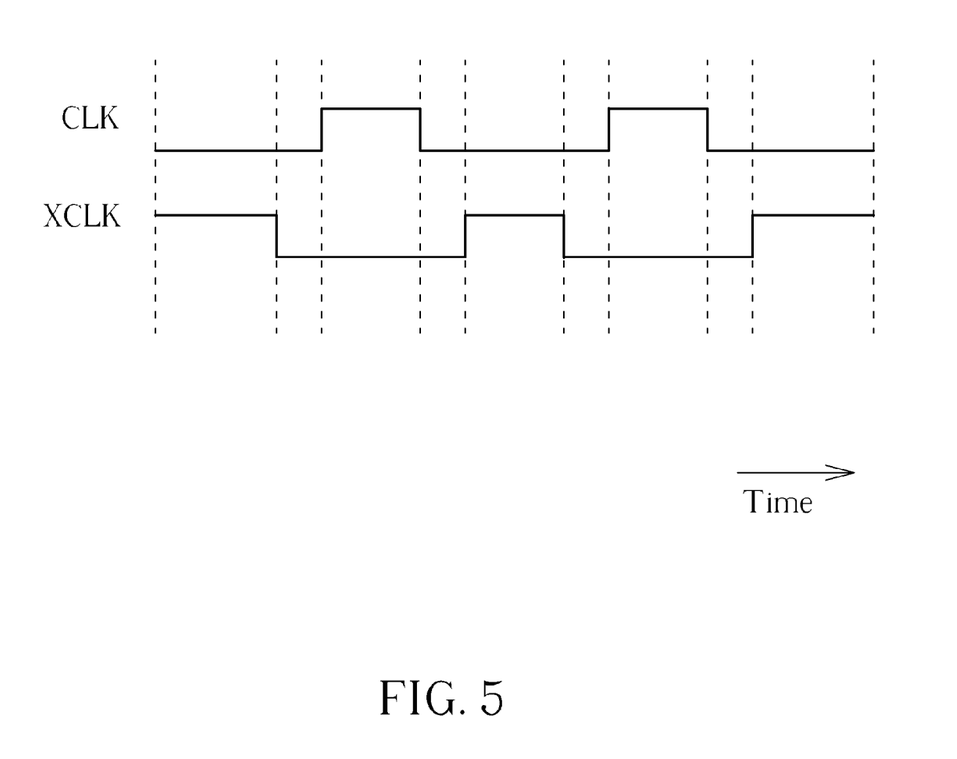
FIG. 5 is another timing diagram of the first clock signal XCLK and the second clock signal CLK in FIG. 1 and FIG. 3.

The first system power terminal VGH and the second system power terminal VGL provide electrical power to the gate driver. In general, a voltage level of the first system power terminal VGH is greater than a voltage level of the second system power terminal VGL. For example, the voltage level of the first system power terminal VGH may be 8.5 volts or other positive voltage, and the voltage level of the second system power terminal VGL may be −8.5 volts or other negative voltage. Moreover, the input signal $S_{IN}$ may be the output of a previous stage shift register 100, or the output of a next stage shift register 100. Please refer to FIG. 2 with reference FIG. 1. FIG. 2 is a timing diagram of the shift register 100. The first clock signal XCLK and the second clock signal CLK are periodical signals. Moreover, the first clock signal XCLK is at a high voltage level when the second clock signal CLK is at a low voltage level; and the first clock signal XCLK is at the low voltage level when the second clock signal CLK is at the high voltage level. In the embodiment, the rising edges of the first clock signal XCLK are aligned with the falling edges of the second clock signals CLK, and the falling edges of the first clock signal XCLK are aligned with the rising edges of the second clock signals CLK. However, the present disclosure is not limited thereto. The shift register 100 would operate normally if the portions of the first clock signal XCLK at the high voltage level do not overlap in the timeline with the portions of the second clock signal CLK at the high voltage level, e.g. the first clock signal XCLK and the second clock signal CLK illustrated in FIG. 5. It should be noted that the first clock signal XCLK is not only inputted into the first end N11 of the first switch M1 of the current stage shift register 100 but also into the control ends N2C of the second switches M2 of the previous stage shift register and the next stage shift register. The second clock signal CLK is not only inputted into the control end N2C of the second switch M2 of the current stage shift register 100 but also into the first ends N11 of the first switches M1 of the previous stage shift register and the next stage shift register. In addition, when the input signal $S_{IN}$ is high, the voltage levels of the first output end O1 and the second output end O2 of the input stage circuit 110 are high.

During the duration T1, the first clock signal XCLK is at the high voltage level, and the second clock signal CLK is at the low voltage level. Since the input signal $S_{IN}$ is not pulled up, the voltage levels of the first input end O1 and the second output end O2 are the low voltage level. Accordingly, the first switch M1, the second switch M2 and the third switch M3 are turned off. Moreover, since the voltage level of the node A within the duration T1 is high, the fourth switch M4 and the fifth switch M5 are turned on. Consequently, the voltage level of the output end SR[n] of the shift register 100 is low.

During the duration T2, the first clock signal XCLK is at the low voltage level, and the second clock signal CLK is at the high voltage level. Since the input signal $S_{IN}$ is pulled up to the high voltage level, the voltage level of the first output end O1 is pulled up to V1. Accordingly, the first switch M1 is turned on, and the voltage levels of the first output end O1 and the second output end O2 are high. Since the second clock signal CLK is at the high voltage level, the second switch M2 and the third switch M3 are turned on. In the embodiment, because a width-to-length ratio (W/L) of the second switch M2 is less than a width-to-length ratio of the third switch M3, an equivalent resistance of the second switch M2 is greater than an equivalent resistance of the third switch M3. Accordingly, a voltage difference between the first end N21 and the second end N22 of the second switch M2 is greater than a voltage difference between the first end N31 and the second end N22 of the third switch M3, such that a voltage level of the node A is pulled down to a low level V0'. Since the voltage level of the node A is equal to the low level V0', the fourth switch M4 and the fifth switch M5 are turned off. Consequently, the voltage level of the output end SR[n] within the duration T2 is kept at a low level. Moreover, in a condition that the second end N22 of the second switch M2 is directly coupled to the node A, the size of the second switch M2 may be less than the size of the third switch M3. In other words, a ration of the width-to-length ratio of the second switch M2 to the width-to-length ratio of the third switch M3 may be less than a predetermined ratio (e.g. 1/22), such that the voltage level of the node A within the duration T2 is kept at the low level V0' to turn off the fourth switch M4 and the fifth switch M5.

During the duration T3, the first clock signal XCLK is at the high voltage level, and the second clock signal CLK is at the low voltage level. Due to the effect of the parasitic capacitance of the first switch M1, since the first clock signal XCLK is pulled up to the high voltage level, the voltage level of the first output end O1 is pulled up from the first voltage level V1 to a third voltage level V2. Where, the first voltage level V1 and the second voltage level V2 are greater than an initial voltage level V0 of the first output end O1 within the duration T1. Moreover, since the second clock signal CLK is low within the duration T3, the second switch M2 is turned off. The third switch M3 is turned on because the voltage level of the second output end O2 is high. Accordingly, the node A is coupled to the second system power terminal VGL, and the voltage level of the node A is pulled down to the initial voltage level V0. The fourth switch M4 and the fifth switch M5 are turned off since the voltage level of the node A is at the initial voltage level V0. Additionally, because the first clock signal XCLK is at the high voltage level, and the first output end O1 is at the second voltage level V2, the first switch M1 is turned on. Consequently, the voltage level of the output end SR[n] of the shift register 100 is pulled up to a high level.

During the duration T4, the first clock signal XCLK is at the low voltage level, the second clock signal CLK is at the high voltage level, and the voltage levels of the first output end O1 and the second output end O2 of the input stage circuit 110 are pulled down to a low level. Consequently, the first switch M1 and the third switch M3 are turned off. Moreover, because the second clock signal CLK is at the high voltage level, the second switch M2 is turned on to pull up the voltage level of the node A to a high level. Since the voltage level of the node A is pulled up to a high level, the fourth switch M4 and the fifth switch M5 are turned on, and the voltage level of the output end SR[n] of the shift register 100 is pulled down to a low level.

During the duration T5, the first clock signal XCLK is at the high voltage level, the second clock signal CLK is at the low voltage level, and the voltage levels of the first output end O1 and the second output end O2 of the input stage circuit 110 are kept at the low level. Accordingly, the first switch M1, the second switch M2 and the third switch M3 are turned off, and the node A is floating to keep the voltage level thereof at the high level. Since the voltage level of the node A is kept at the high level, the fourth switch M4 and the fifth switch M5 are still turned on, and the voltage level of the output end SR[n] of the shift register 100 is kept at the low level.

Figure 3:
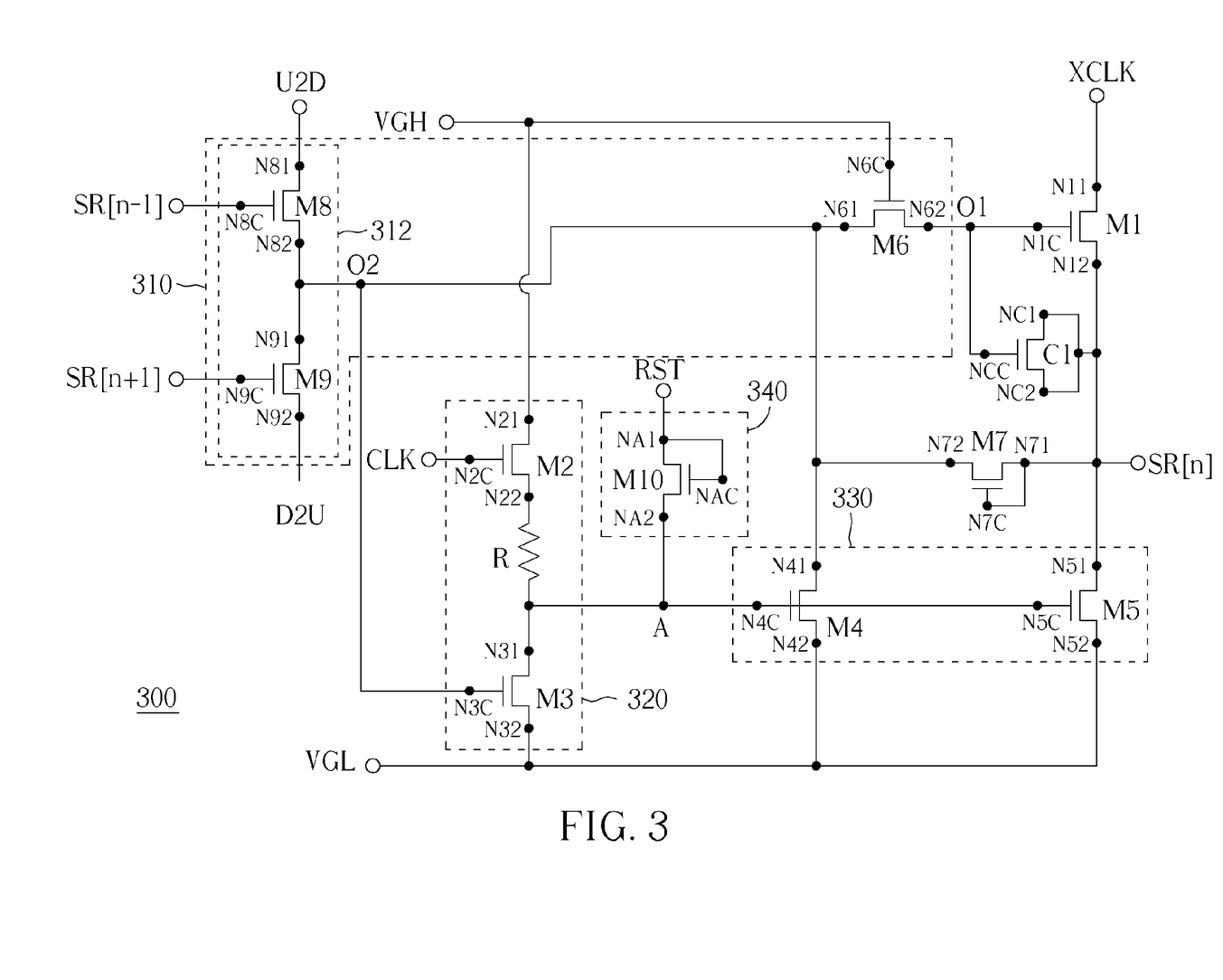
FIG. 3 is a circuit diagram of a shift register according to another embodiment of the present disclosure.

Please refer to FIG. 3. FIG. 3 is a schematic diagram of a shift register 300 according to another embodiment of the present disclosure. The shift register 300 may be utilized in a gate driver of a display panel, and the gate driver may comprise a plurality of stages of the shift register 300 to provide a plurality of gate signals to controls the operations of turning on/off the pixels of the display panel. The shift register 300 has an input stage circuit 310, the first switch M1, a first control circuit 320 and a pull down circuit 330. The input stage circuit 310 has two input ends. One of the two input ends of the input stage circuit 310 is coupled to the output end SR[n−1] of the previous stage shift register 300, and the other input end of the input stage circuit 310 is coupled to the output end SR[n+1] of a next stage shift register 300. Accordingly, the input signals of the current stage shift register 300 are the output signals of the previous stage shift register 300 and the next stage shift register 300.

The first end N11 of the first switch M1 is configured to receive the first clock signal XCLK, the second end N12 of the first switch M1 is coupled to the output end SR[n] of the shift register 300, and the control end N1C of the first switch M1 is coupled to the first output end O1 of the input stage circuit 310. The first control circuit 320 comprises the second switch M2 and the third switch M3. The first end N21 of the second switch M2 is coupled to the first system power terminal VGH, the second end N22 of the second switch M2 is coupled to the node A, and the control end N2C of the second switch M2 is configured to receive the second clock signal CLK. The first end N31 of the third switch M3 is coupled to the node A, the second end N32 of the third switch M3 is coupled to the second system power terminal VGL, and the control end N3C of the third switch M3 is coupled to the second output end O2 of the input stage circuit 310. The pull down circuit 330 comprises the fourth switch M4 and the fifth switch M5. The first end N41 of the fourth switch M4 is coupled to the second output end O2 of the input stage circuit 310, the second end N42 of the fourth switch M4 is coupled to the second system power terminal VGL, and the control end N4C of the fourth switch M4 is coupled to the node A. The first end N51 of the fifth switch M5 is coupled to the output end SR[n] of the shift register 300, the second end N52 of the fifth switch M5 is coupled to the second system power terminal VGL, and the control end N5C of the fifth switch M5 is coupled to the node A.

Figure 4:
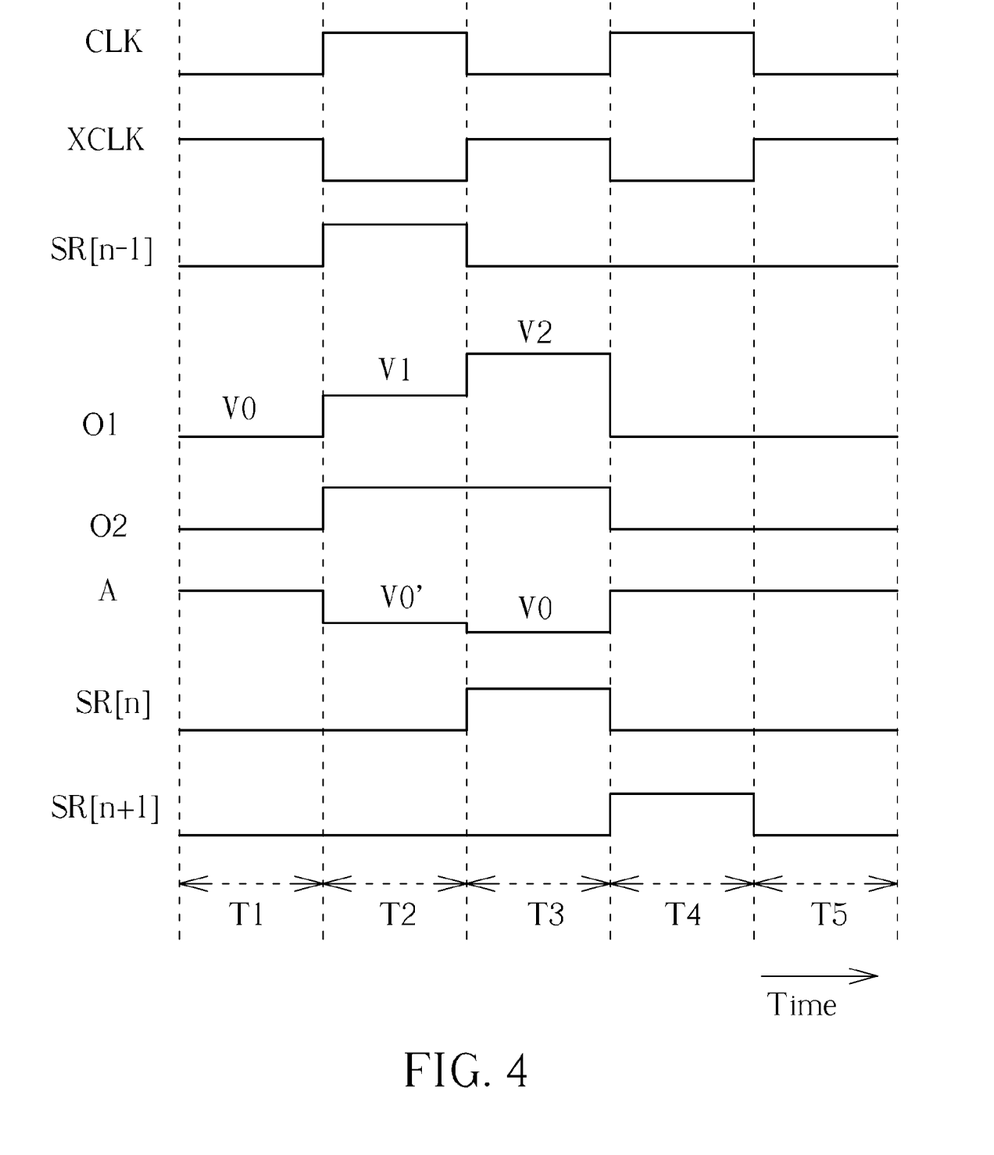
FIG. 4 is a timing diagram of the shift register in FIG. 3.
Figure 9:
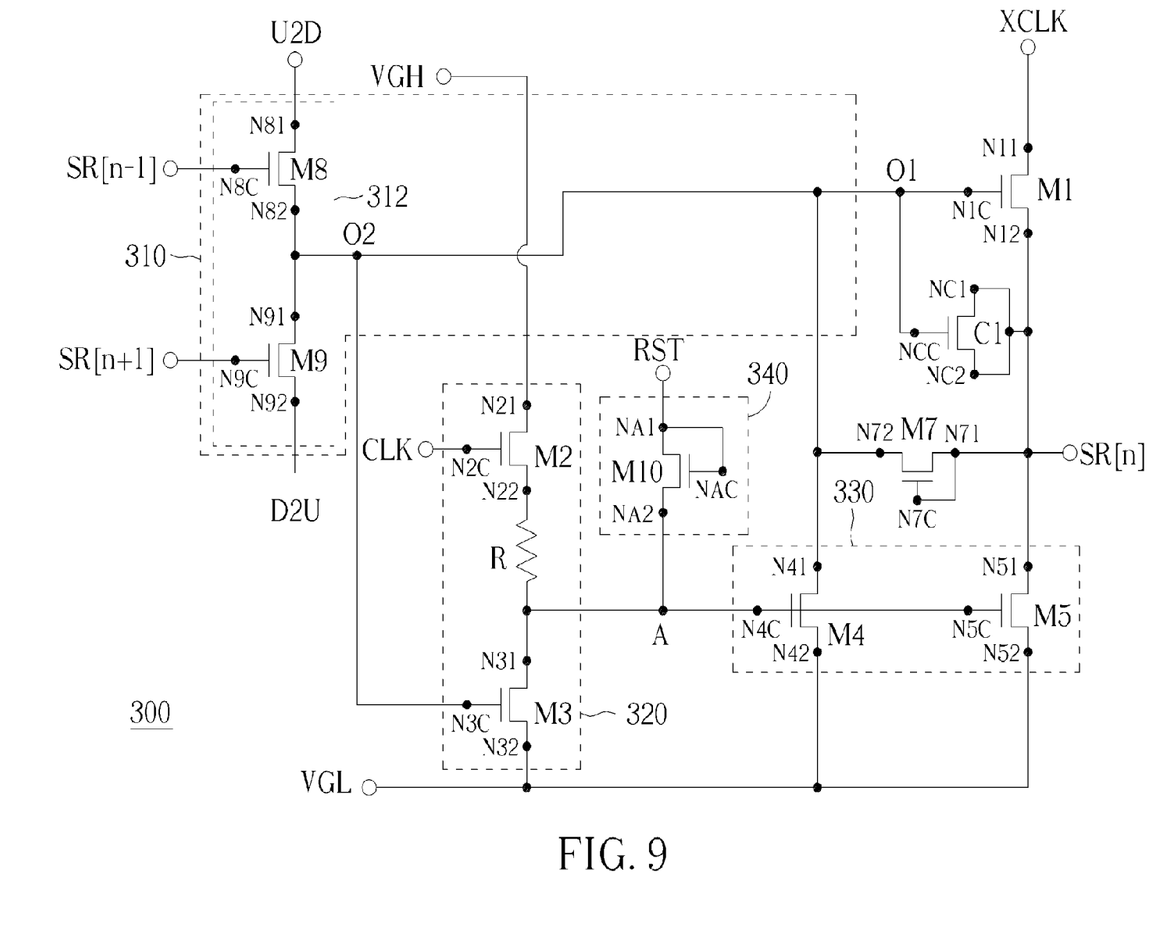
FIG. 9 is a circuit diagram of a shift register according to another embodiment of the present disclosure.

The input stage circuit 310 has a sixth switch M6 configured to keep the voltage level of the second output end O2 at a voltage level below the first voltage level V1 during the durations T2 and T3. A first end N61 of the sixth switch M6 is coupled to the second output end O2 of the input stage circuit 310, a second end N62 of the sixth switch M6 is coupled to the first output end O1 of the input stage circuit 310, and a control end N6C of the sixth switch M6 is coupled to the first system power terminal VGH. Therefore, when the shift register 300 is powered by electricity, the sixth switch M6 is turned on continuously. The function of the sixth switch M6 would be descripted as follows. Please refer to FIG. 4 with reference of FIG. 3. FIG. 4 is a timing diagram of the shift register 300 in FIG. 3. When the voltage level of the first output end O1 is pulled up from the first level V1 to the second level V2 during the duration T3, because of the sixth switch M6, the voltage level of the second output end O2 within the duration T3 is kept at the same level as that within the duration T2. Therefore, the voltage level of the second output end O2 is not pulled up to the second level V2 during the duration T3, such that the voltage difference between the first end N41 and the second end N42 of the first switch M4 is not pulled up during the duration T3. Accordingly, a leakage current of the fourth switch M4 is not increased since the voltage difference between the first end N41 and the second end N42 is not increased. However, the shift register 300 also can operate normally without the sixth switch M6. In such case, the first output end O1 is directly coupled to the second output end O2, but is not directly coupled to the first system power terminal VGH, as shown in FIG. 9. Thus, because of the existence of the sixth switch M6, the leakage current of the fourth switch M4 is limited. Accordingly, the leakage current of the shift register 300 is restrained, the power consumption of the shift register 300 is reduced, and the tolerance of the shift register 300 for the leakage current is increased.

In an embodiment of the present disclosure, the shift register 300 may further comprise a seventh switch M7 for keeping the voltage level O2 of the second output end O2 within the duration T3. A first end N71 and a control end N7C of the seventh switch M7 are coupled to the output end SR[n] of the shift register 300, and a second end N72 of the seventh switch M7 is coupled to the second output end O2 of the input stage circuit 310. As shown in FIG. 4, the voltage level of the output end SR[n] of the shift register 300 is at a high voltage level during the duration T3. Because of the seventh switch M7, the voltage level of the second output end O2 within the duration T3 is kept at ($V_{SRN}$-$V_{TH}$), where $V_{SRN}$ is the voltage level of the output end SR[n] within the duration T3, and $V_{TR}$ is the threshold voltage of the seventh switch M7. The shift register 300 also can operate normally without the seventh switch M7. However, because of the existence of the seventh switch M7, the voltage level of the second output end O2 within the duration T3 is not decreased due to the leakage current of the fourth switch M4, such that the tolerance of the shift register 300 for the leakage current is increased.

In an embodiment of the present disclosure, the shift register 300 may further comprise a capacitor C1, which is coupled between the first output end O1 of the input stage circuit 310 and the output end SR[n] of the shift register 300 and configured to stabilize the voltage levels of the first output end O1 and the output end SR[n] and to reduce the leakage current. The capacitor C1 may be made of a dielectric layer located between two conductive layers, but the present disclosure is not limited thereto. Take FIG. 3 for example, the capacitor C1 may be an N-type metal-oxide-semiconductor field-effect transistor (NMOSFET), an N-type thin-film transistor (TFT), etc., or other transistors selected based on the manufacture procedure of the shift register 300. However, the present disclosure is not limited thereto. In the embodiment, the capacitor C1 is a transistor which has a gate NCC coupled to the first output end O1, and a source NC1 and a drain NC2 are coupled to the output end SR[n] of the shift register 300.

In the embodiment of the present disclosure, the input stage circuit 310 comprises a bidirectional selection circuit 312 configured to selectively output one of the input signal received from the output end SR[n−1] of the previous stage shift register 300 and the input signal received from the output end SR[n+1] of the next stage shift register 300. The bidirectional selection circuit 310 may comprise an eighth switch M8 and a ninth switch M9. A first end N81 of the eighth switch M8 is configured to receive a first selection signal U2D, a second end N82 of the eighth switch M8 is coupled to the second output end O2 of the input stage circuit 310, and a control end N8C of the eighth switch M8 is configured to receive the input signal from the output end SR[n−1] of the previous stage shift register 300. A first end of the ninth switch M9 is coupled to the second output end O2 of the input stage circuit 310, a second end N92 of the ninth switch M9 is configured to receive a second selection signal D2U, and a control end NC9 of the ninth switch M9 is configured to receive the input signal from the output end SR[n+1] of the next stage shift register 300. The first selection signal U2D is at a high voltage level when the second selection signal D2U is at a low voltage level. The first selection signal U2D is at the low voltage level when the second selection signal D2U is at the high voltage level. Accordingly, the bidirectional selection circuit 312 is capable of selectively outputting one of the input signal received from the output end SR[n−1] of the previous stage shift register 300 and the input signal received from the output end SR[n+1] of the next stage shift register 300. For example, when the first selection signal U2D is at a high voltage level and the second selection signal D2U is at a low voltage level, the bidirectional selection circuit 312 outputs the input signal received from the output end SR[n−1] of the previous stage shift register 300. Accordingly, as shown in FIG. 4, the voltage level of the output end SR[n−1] is high within the duration T2, and then the voltage level of the output end SR[n+1] is high within the duration T4. Therefore, the voltage level of the second output end O2 is pulled up from a low level to a high level within the duration T2, and the voltage level of the second output end O2 is pulled down from the high level to the low level within the duration T4.

In an embodiment of the present disclosure, the shift register 300 further comprises a reset circuit 340 configured to reset the voltage level of the node A according to a reset signal RST. The reset circuit 340 comprises a tenth switch M10. A first end NA1 and a control end NAC of the tenth switch M10 are configured to receive the reset signal RST, and a second end NA2 of the tenth switch M10 is coupled to the node A. When the reset signal RST is at a high voltage level, the tenth switch M10 is turned on, such that the node A is at a high voltage level to turn on the fourth switch M4 and the fifth switch M5. Accordingly, the output end SR[n] and the second output end O2 are coupled to the second system power terminal VGL.

In an embodiment of the present disclosure, the first control circuit 320 may further comprise a resistor R coupled between the second end N22 of the second switch M2 and the node A. The resistor R is configured to reduce the current flowing through the second switch M2 and the third switch M3 when both of the second switch M2 and the third switch M3 are turned on (e.g. within the duration T2), such that the power consumption of the shift register 300 is reduced. In addition, due to the existence of the resistor R, the voltage level of the node A within the duration T2 is low enough to turn off the fourth switch M4 and the fifth switch M5. Accordingly, without changing the width-to-length (W/L) ratio of any transistor, the layout area of the shift register 300 is further reduced due to the resistor R.

In embodiment of the present disclosure, each of the first switch M1, the second switch M2, the third switch M3, the fourth switch M4, the fifth switch M5, the sixth switch M6, the seventh switch M7, the eighth switch M8, the ninth switch M9 and the tenth switch M10 may be an N-type transistor (e.g. an N-type thin-film transistor (TFT) or an NMOSFET), and the control end of each switch is the gate of the N-type transistor. Accordingly, the number of photomasks and the cost for manufacturing the shift register are reduced, and the manufacturing procedure of the shift register is simplified.

Figure 6:
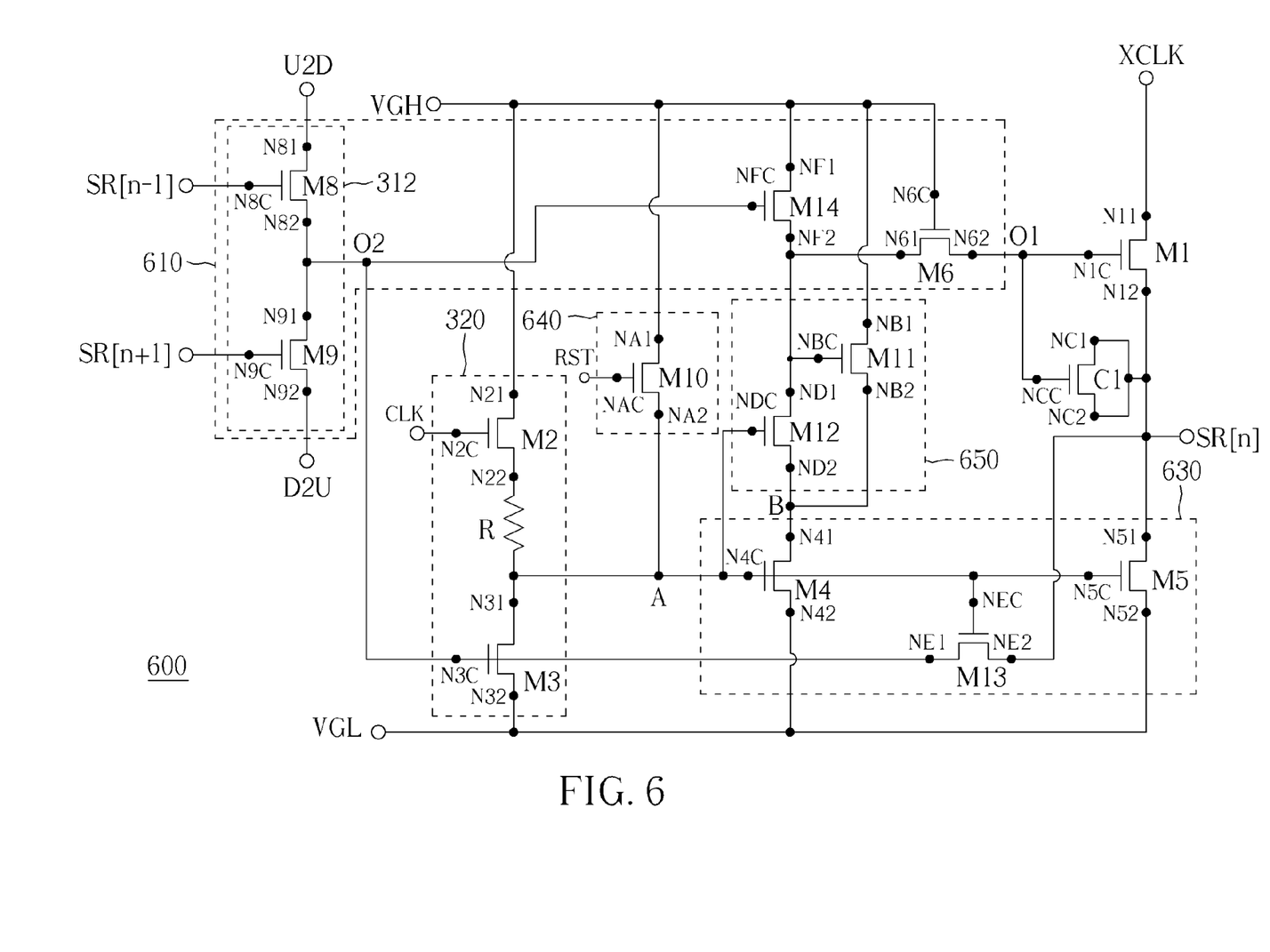
FIG. 6 is a circuit diagram of a shift register according to another embodiment of the present disclosure.

In order to farther reduce the leakage current of the shift register and to increase the process window of the shift register, a second control circuit may be added. Please refer to FIG. 6. FIG. 6 is a circuit diagram of a shift register 600 according to another embodiment of the present disclosure. The shift register 600 comprises an input stage circuit 610, the first switch M1, the first control circuit 320, a second control circuit 650 and a pull down circuit 630.

The input stage circuit 610 of the shift register 600 still has two input ends. One of the two input ends of the input stage circuit 610 is coupled to the output end SR[n−1] of the previous stage shift register 600, and the other input end of the input stage circuit 610 is coupled to the output end SR[n+1] of a next stage shift register 600. Accordingly, the input signals of the current stage shift register 600 are the output signals of the previous stage shift register 600 and the next stage shift register 600. The first end N11 of the first switch M1 is configured to receive the first clock signal XCLK, the second end N12 of the first switch M1 is coupled to the output end SR[n] of the shift register 600, and the control end N1C of the first switch M1 is coupled to the first output end O1 of the input stage circuit 610. The function of the first control circuit 320 of the shift register 600 is same as the function of the first control circuit 320 of the shift register 300. Therefore, related descriptions about the first control circuit 320 are not repeated herein.

The second control circuit 650 is configured to farther reduce the leakage current of the shift register and to increase the process window of the shift register 600. The second control circuit 650 comprises an eleventh switch M11 and a twelfth switch M12. A first end NB1 of the eleventh switch M11 is coupled to the first system power terminal, a second end NB2 of the eleventh switch M11 is coupled to the first end N41 of the fourth switch M4, and a control end NBC of the eleventh switch M11 is coupled to the input stage circuit 610. A first end ND1 of the twelfth switch M12 is coupled to the control end NBC of the eleventh switch M11, a second end ND2 of the twelfth switch M12 is coupled to the first end N41 of the fourth switch M4, and a control end NDC of the twelfth switch M12 is coupled to the node A.

The input stage circuit 610 of the shift register 600 comprises the foresaid bidirectional selection circuit 312, a sixth switch M6 and a fourteenth switch M12. A first end N61 of the sixth switch M6 is coupled to the control end NBC of the eleventh switch M11 and the first end ND1 of the twelfth switch M12, a second end N62 of the sixth switch M6 is coupled to the first output end O1 of the input stage circuit 610, and a control end N6C of the sixth switch M6 is coupled to the first system power terminal VGH. A first end NF1 of the fourteenth switch M14 is coupled to the first system power terminal, a second end NF2 of the fourteenth switch M14 is coupled to the control end NBC of the eleventh switch M11 and the first end ND1 of the twelfth switch M12, and a control end NFC of the fourteenth switch M14 is coupled to the second output end O2 of the input stage circuit 610.

The pull down circuit 630 comprises the fourth switch M4, the fifth switch M5 and a thirteenth switch M13. The first end N41 of the fourth switch M4 is coupled to the second output end O2 of the input stage circuit 310 via the second control circuit 650 and the fourteenth switch M14 of the input stage 610. The second end N42 of the fourth switch M4 is coupled to the second system power terminal VGL, and the control end N4C of the fourth switch M4 is coupled to the node A. The first end N51 of the fifth switch M5 is coupled to the output end SR[n] of the shift register 600, the second end N52 of the fifth switch M5 is coupled to the second system power terminal VGL, and the control end N5C of the fifth switch M5 is coupled to the node A. A first end NE1 of the thirteenth switch M13 is coupled to the second output end O2 of the input stage circuit 610, a second end NE2 of the thirteenth switch M13 is coupled to the output end SR[n] of the shift register 600, and a control end NEC of the thirteenth switch M13 is coupled to the node A. As compared to the pull down circuit 330 of the shift register 300, the pull down circuit 630 further uses the thirteenth switch M13 to pull down the voltage level of the output end SR[n] more efficiently.

Figure 7:
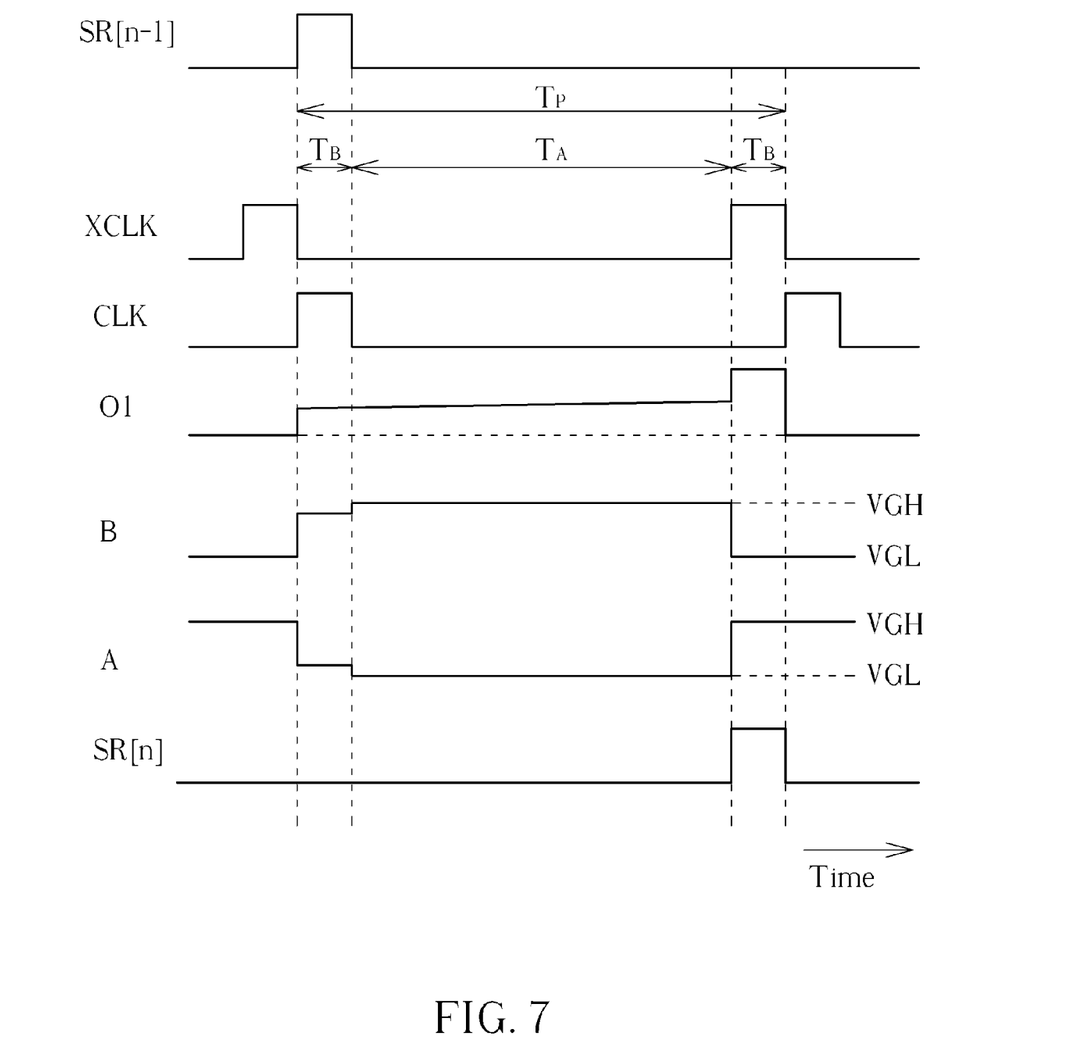
FIG. 7 is a timing diagram of the shift register in FIG. 6.

Please refer to FIG. 6 with reference of FIG. 7. FIG. 7 is a timing diagram of the shift register 600. In the embodiment, the first clock signal XCLK and the second clock signal CLK have the same period $T_P$, and $T_P = T_A + 2T_B$, where the duration $T_A$ is much longer than two of the duration $T_B$ (i.e. $2T_A$). Within the duration $T_B$, the first output end O1 of the input stage circuit 610 is floating. Therefore, a leakage current flowing from the first output end O1 to the second system power terminal VGL has a great influence on the voltage level of the first output end O1. Since the duration $T_A$ is much longer than the duration $T_B$, the voltage level of the first output end O1 may fall too fast if the leakage current flowing from the first output end O1 is too large, and the shift register 600 may fail to operate. In order to avoid the foresaid phenomena, the second control circuit 650 is added to farther reduce the leakage current of the shift register 600. As shown in FIG. 7, within the duration $T_A$, the voltage level of the node A is equal to the voltage level of the second system power terminal VGL, and the voltage level of the node B is equal to the voltage level of the first system power terminal VGH. Since the voltage difference between the control end NDC (e.g. the gate) and the second end (e.g. the source) of the fourteenth switch M14 is equal to the difference of the voltage levels of the nodes A and B (i.e. VGL-VGH), the leakage current flowing from the first output end O1 through the fourteenth switch M14 to the second system power terminal VGL is almost equal to zero. Accordingly, the shift register 600 operates normally even if the duration $T_A$ is too long. Moreover, since VGL is lower than VGH, and the voltage difference between the control end NDC (e.g. the gate) and the second end (e.g. the source) of the fourteenth switch M14 is equal to (VGL-VGH) within the duration $T_A$, the process window of the shift register 600 is greater than the process window of the shift register 300. In other words, in the condition that the shift registers 300 and 600 would operate normally, a range of the threshold voltages of the switches (e.g. M1 to M6 and M8 to M14) of the shift register 600 is greater than that of the shift register 300.

In an embodiment of the present disclosure, the shift register 600 further comprises a reset circuit 640, which is configured to reset the voltage level of the node A according to the reset signal RST. The reset circuit 640 comprises a tenth switch M10. A first end NA1 of tenth switch M10 is coupled to the first system power terminal VGH, a second end NA2 of tenth switch M10 is coupled to the node A, and a control end NAC of tenth switch M10 is configured to receive the reset signal RST. When the reset signal RST is at a high voltage level, the tenth switch M10 is turned on, such that the node A is at a high voltage level to turn on the fourth switch M4, the fifth switch M5, and the twelfth switch M12. Accordingly, the output end SR[n] is coupled to the second system power terminal VGL, and the shift register 600 is reset.

Figure 8:
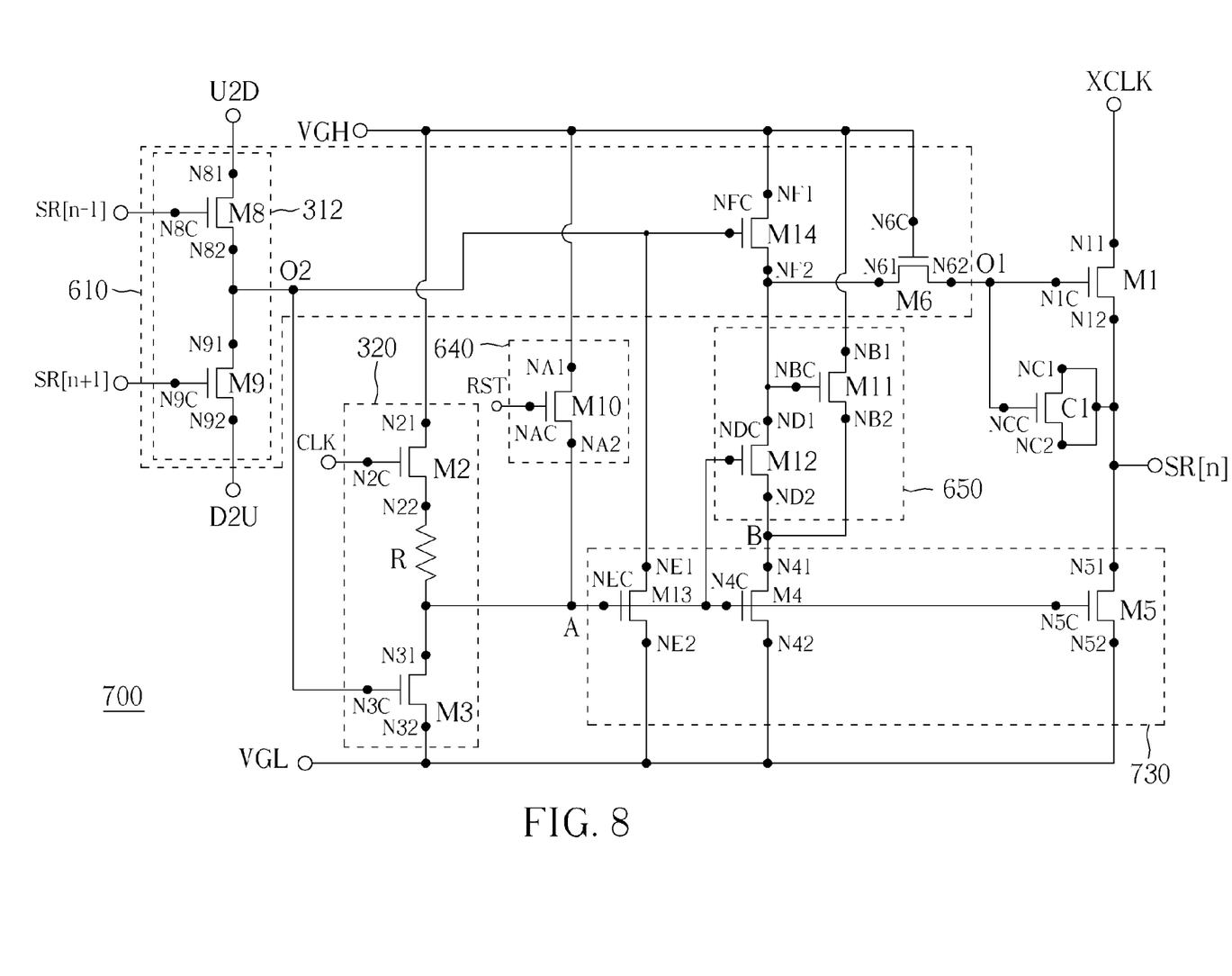
FIG. 8 is a circuit diagram of a shift register according to another embodiment of the present disclosure.

Please refer to FIG. 8. FIG. 8 is a circuit diagram of a shift register 700 according to another embodiment of the present disclosure. The difference between the two shift registers 600 and 700 is the connections of the thirteenth switch M13. In the embodiment, the first end NE1 of the thirteenth switch M13 is coupled to the second output end O2 of the input stage circuit 610, the second end NE2 of the thirteenth switch M13 is coupled to the second system power terminal VGL, and the control end NEC of the thirteenth switch M13 is coupled to the node A. The thirteenth switch M13, the fourth switch M4 and the fifth switch M5 compose the pull down circuit 730 of the shift register 700. As compared to the pull down circuit 330 of the shift register 300, the pull down circuit 730 pulls down the voltage level of the output end SR[n] more efficiently due to the thirteenth switch M13.

In summary, the shift register according to the embodiments of the present disclosure is capable of suppressing the leakage current, such that the energy consumption is reduced. Moreover, the shift register has fewer transistors due to a compact design, such that the cost thereof could be increased and that it is suitable to achieve the narrow peripheral region design of the display panel, where the peripheral region is located around a matrix of the pixels of the display panel. Moreover, each of the switches may be an N-type thin-film transistor (TFT), an NMOSFET, or other transistors selected based on the manufacture procedure. Accordingly, the number of photo-masks for manufacturing the shift register is reduced, and the manufacturing procedure of the shift register is simplified.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A shift register, comprising:
    an input stage circuit, configured to receive at least an input signal;
    a first switch, a first end of the first switch being configured to receive a first clock signal, a second end of the first switch being coupled to an output end of the shift register, and a control end of the first switch being coupled to a first output end of the input stage circuit;
    a first control circuit, comprising:
        a second switch, a first end of the second switch being coupled to a first system power terminal, a second end of the second switch being coupled to a node, and a control end of the second switch being configured to receive a second clock signal; and
        a third switch, a first end of the third switch being coupled to the node, a second end of the third switch being coupled to a second system power terminal, and a control end of the third switch being coupled to a second output end of the input stage circuit;
    a pull down circuit, comprising:
        a fourth switch, a first end of the fourth switch being coupled to a second node circuit, a second end of the fourth switch being coupled to the second system power terminal, and a control end of the fourth switch being coupled to the node; and
        a fifth switch, a first end of the fifth switch being coupled to the output end of the shift register, a second end of the fifth switch being coupled to the second system power terminal, and a control end of the fifth switch being coupled to the node; and
    a second control circuit, comprising:
        an eleventh switch, a first end of the eleventh switch being coupled to the first system power terminal, a second end of the eleventh switch being coupled to the first end of the fourth switch, and a control end of the eleventh switch being coupled to the input stage circuit; and
        a twelfth switch, a first end of the twelfth switch being coupled to the control end of the eleventh switch, a second end of the twelfth switch being coupled to the first end of the fourth switch, and a control end of the twelfth switch being coupled to the node.

2. The shift register of claim 1, wherein the first clock signal is at a high voltage level when the second clock signal is at a low voltage level; and
    wherein the first clock signal is at the low voltage level when the second clock signal is at the high voltage level.

3. The shift register of claim 1, wherein the input stage circuit comprises a sixth switch, a first end of the sixth switch is coupled to the second output end of the input stage circuit, a second end of the sixth switch is coupled to the first output end of the input stage circuit, and a control end of the sixth switch is coupled to the first system power terminal.

4. The shift register of claim 1, wherein the at least an input signal comprises a first input signal and a second input signal, and the input stage circuit comprises a bidirectional selection circuit configured to selectively output one of the first input signal and the second input signal.

5. The shift register of claim 4, wherein the bidirectional selection circuit comprises:
- an eighth switch, a first end of the eighth switch being configured to receive a first selection signal, a second end of the eighth switch being coupled to the second output end of the input stage circuit, and a control end of the eighth switch being configured to receive the first input signal; and
- a ninth switch, a first end of the ninth switch being coupled to the second output end of the input stage circuit, a second end of the ninth switch being configured to receive a second selection signal, and a control end of the ninth switch being configured to receive the second input signal.

6. The shift register of claim 5, wherein the first selection signal is at a high voltage level when the second selection signal is at a low voltage level; and
wherein the first selection signal is at the low voltage level when the second selection signal is at the high voltage level.

7. The shift register of claim 1 further comprising:
a reset circuit, configured to reset a voltage level of the node according to a reset signal.

8. The shift register of claim 7, wherein the reset circuit comprises:
a tenth switch, a first end and a control end of the tenth switch being configured to receive the reset signal, and a second end of the tenth switch being coupled to the node.

9. The shift register of claim 7, wherein the reset circuit comprises:
a tenth switch, a first end of tenth switch being coupled to the first system power terminal, a second end of tenth switch being coupled to the node, and a control end of tenth switch being configured to receive the reset signal.

10. The shift register of claim 1 further comprising:
a capacitor, coupled between the first output end of the input stage circuit and the output end of the shift register.

11. The shift register of claim 10, wherein the capacitor is an N type transistor having a gate, a source and a drain, the gate is coupled to the first output end, and the source and the drain are coupled to the output end of the shift register.

12. The shift register of claim 1, wherein the first control circuit further comprises a resistor coupled between the second end of the second switch and the node.

13. The shift register of claim 1, wherein the pull down circuit further comprises a thirteenth switch; and
wherein a first end of the thirteenth switch is coupled to the second output end of the input stage circuit, a second end of the thirteenth switch is coupled to the output end of the shift register, and a control end of the thirteenth switch is coupled to the node.

14. The shift register of claim 1, wherein the pull down circuit further comprises a thirteenth switch; and
wherein a first end of the thirteenth switch is coupled to the second output end of the input stage circuit, a second end of the thirteenth switch is coupled to the second system power terminal, and a control end of the thirteenth switch is coupled to the node.

15. The shift register of claim 1, wherein the input stage circuit comprises a sixth switch and a fourteenth switch;
wherein a first end of the sixth switch is coupled to the control end of the eleventh switch and the first end of the twelfth switch, a second end of the sixth switch is coupled to the first output end of the input stage circuit, and a control end of the sixth switch is coupled to the first system power terminal; and
wherein a first end of the fourteenth switch is coupled to the first system power terminal, a second end of the fourteenth switch is coupled to the control end of the eleventh switch and the first end of the twelfth switch, and a control end of the fourteenth switch is coupled to the second output end of the input stage circuit.

* * * * *